(12) United States Patent
Yokoyama et al.

(10) Patent No.: US 6,414,271 B2
(45) Date of Patent: Jul. 2, 2002

(54) CONTACT HEATING DEVICE

(75) Inventors: Kiyoshi Yokoyama; Takafumi Turumaru; Hiroyuki Arima; Hideaki Shimozuru, all of Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/863,685

(22) Filed: May 22, 2001

(30) Foreign Application Priority Data

May 25, 2000 (JP) ........................................ 2000-154917
Jun. 29, 2000 (JP) ........................................ 2000-195729

(51) Int. Cl.[7] .............................. H05B 1/00; H05B 3/68
(52) U.S. Cl. .................. 219/243; 219/443.1; 219/444.1
(58) Field of Search .................................. 219/243, 221, 219/227, 526, 536, 546, 548, 530, 540, 245, 254, 255, 258, 444.1, 465.1, 466.1, 467.1, 544; 269/21; 156/583.1, 583.21, 583.4; 279/3; 100/301, 305; 118/725, 727, 728, 729, 724

(56) References Cited

U.S. PATENT DOCUMENTS

| | | | | |
|---|---|---|---|---|
| 4,278,867 A | * | 7/1981 | Tan ........................ | 219/121.64 |
| 5,151,871 A | * | 9/1992 | Matsumura et al. ........ | 700/300 |
| 5,155,331 A | * | 10/1992 | Horiuchi et al. ....... | 219/121.43 |
| 5,539,179 A | * | 7/1996 | Nozawa et al. ......... | 219/121.43 |
| 5,796,074 A | * | 8/1998 | Edelstein et al. ........... | 219/390 |
| 5,851,298 A | * | 12/1998 | Ishii ........................... | 118/728 |
| 5,854,468 A | * | 12/1998 | Muka ...................... | 219/444.1 |
| 5,904,872 A | * | 5/1999 | Arami et al. ............ | 219/444.1 |
| 6,040,562 A | * | 3/2000 | Tokumoto et al. .......... | 219/530 |
| 6,080,969 A | * | 6/2000 | Goto et al. .............. | 219/444.1 |

FOREIGN PATENT DOCUMENTS

| | | |
|---|---|---|
| JP | 10-134938 | 5/1998 |
| JP | 11-240762 | 9/1999 |
| JP | 11-339929 | 12/1999 |

* cited by examiner

*Primary Examiner*—Teresa Walberg
*Assistant Examiner*—Vinod D Patel
(74) *Attorney, Agent, or Firm*—Hogan & Hartson, LLP.

(57) ABSTRACT

There is provided a bonding heater used to package a semiconductor chip on a multilayer substrate, which has adaptability to various chip sizes, with an excellent maintenance characteristics, with undesirable displacement of the chip at the time of mounting a semiconductor chip being made as small as possible and also with a temperature rise time to a desired temperature being shortened. This bonding heater is constituted by a ceramic tool for pressing an object to be heated, a ceramic heater for heating the tool, a heat insulating member for transferring heat generated by the ceramic heater mainly to the tool side and a holder for integrating these members and connecting these members to another member, and the tool, ceramic heater, heat insulating member and holder are detachably bonded.

13 Claims, 6 Drawing Sheets

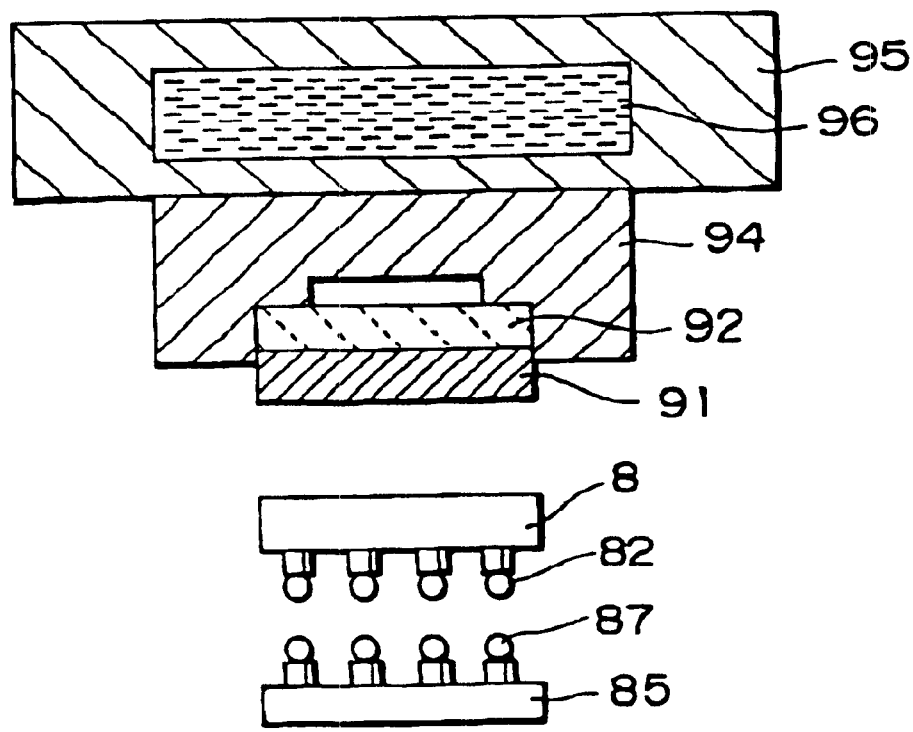

US 6,414,271 B2

CONTACT HEATING DEVICE

BACKGROUND OF THE INVENTION

1. Field of the Invention

The present invention relates to a contact heating device for heating an object to be heated in contact therewith such as a die bonding heater or the like used when a semiconductor bare chip is mounted on a substrate.

2. Prior Art

As a packaging method for mounting a semiconductor bare chip on a circuit substrate, the ACF bonding method is known, by which pad electrodes on a chip and those on a substrate are bonded by using a resin-based adhesive such as an anisotropic conductive film or the like. As another mounting method, the flip chip bonding method, by which pad electrodes on a chip and those on a substrate are bonded by using low melting braze material such as Au—Si, Au—Sn alloys or the like, is also utilized for manufacturing multiple chip modules.

As shown in FIG. 5A, in the flip chip bonding method, a semiconductor chip 8 is placed on a multi-layered substrate 85, a pressing tool 910 fixedly bonded to a bonding heater 92 is brought into contact with an upper surface of the chip 8 and then the chip is pressed while heated. The semiconductor chip 8 is brazed on the substrate 85 by melting solders 82, 87 between pad electrodes 81, 86. After cooling, bonding of the pad electrodes 81, 86 and wiring are completed and the semiconductor chip 8 is fixed on the substrate 85. After this operation, the pressing tool 910 is separated from the semiconductor chip 8 and moved to another semiconductor chip 8. The pressing tool 910 captures the chip to carry out the same bonding operation.

As characteristics of a bonding heater 92, firstly, it is required to efficiently transfer necessary and sufficient heat to the bond material via a semiconductor chip 8 in order to soften or melt bond material such as solders 82, 87 used for bonding of bump electrodes or the like.

Secondly, from the viewpoint of production efficiency, it is important that time for a temperature rise to a required temperature and time for a temperature fall after bonding until the bond material is solidified are both short.

Thirdly, since pressure as well as heat is applied when a semiconductor chip 8 is bonded, the bonding heater 92 and tool 910 are required to have mechanical strength and abrasion resistance.

To achieve these performances, the bonding heater 92 is constituted by a sintered body composed of a small amount of heat-resistant metal such as titanium, molybdenum or the like as a sintering additive and diamond particles (for example, a diamond sintered body, as disclosed in Japanese Patent Laid-Open Publication No. 11-240762) and utilized as a tool 910. This is a pulse heater method, in which large pulse current is allowed to flow in the heat-resistant metal itself such as titanium, molybdenum or the like contained in the tool in order to heat the tool.

Japanese Patent Laid-Open Publication No. 10-134938 discloses a bonding heater shown in FIG. 5B. The heater is composed of a ceramic head 91 (or tool) and a ceramic holder 94 for connecting the head 91 to another member. Here, a thermal conductivity of the head 91 is made higher than that of the holder 94. The head 91 is fixedly bonded to a ceramic heater 92 by using a high melting point glass bonding layer 911. Glass material of this bonding layer 911 has a composition consisting of a combination of any selecting from silicon nitride, aluminum nitride, alumina, silicon oxide, zirconia, alkaline-earth metal oxide and rare-earth element oxide and has a high melting point of 1500–1800° C.

To accelerate a temperature fall, in Japanese Patent Laid-Open Publication No. 11-339929, use of a water cooling jacket is proposed to improve a temperature fall speed which is slow due to cooling by standing. As shown in FIG. 6, the water cooling jacket 96 is embedded in a holder body 95 and forcibly cools the holder 94, thereby indirectly cooling the bonding heater 92 and tool 91 provided to the heater holder 94.

While, microcomputers requiring a small size, high density and high speed processing such as a portable telephone, mobile computer and the like are rapidly being further widespread, higher performances are being achieved. Under these circumstances, more highly integrated semiconductor chip packaging and miniaturization are further required. Along with this, semiconductor chips have a more variety of sizes and are required to be mounted on multi-layered packaging substrates.

In the conventional bonding heater as shown in an example in FIG. 5A, as described above, a bonding heater 92 and tool 910 are integrally bonded to each other. In an example in FIG. 5B as well, a ceramic heater 92 and a head 91 are completely bonded by a bonding material 911. Therefore, such conventional bonding heaters are not adaptable to chips having different chip sizes. In addition, even if only either the tool 91 and 910 or bonding heater 92 is damaged, both of these need to be replaced.

In the bonding heater 92, the tool 91 and 910 needs to have a uniform surface temperature over tho surface area in order to uniformly bond pad electrodes on the whole surface of a semiconductor chip 8. However, the conventional bonding heater 92 has a disadvantage that the temperature of a peripheral portion of the tool 91 and 910 lowers due to heat dissipation into air.

Since location accuracy of mounting or the like in semiconductor chip packaging significantly affects performances of electronic equipment, deformation of the contact heating device itself due to thermal expansion is also a problem. When the contact heating device employs a pulse heater method, large current pulses are applied to a resistor composed of titanium or molybdenum for a rapid temperature rise. As a result, the heater itself is vibrated and the actually mounted position is displaced from the position where the semiconductor chip 8 is originally located. This displacement significantly affects performances of the electronic equipment on which the semiconductor chip is mounted.

On the other hand, in a constant heater method, in which the heater is continuously used, when the heater is used at a temperature of 500° C., the temperature of the holder 94 rises to 100–150° C. However, since the holder 94 is composed of metallic material, a warpage occurs due to a temperature distribution generated in the holder 94. Consequently, accuracy of semiconductor chip mounting location is deteriorated.

The bonding heater 92 is also required to speed up a temperature rise and temperature fall to shorten the work tact. In particular, in the above flip chip process, the temperature needs to be rapidly increased to a prescribed temperature to soften the bond material and position the semiconductor chip 8. However, it takes a long time to heat up the bonding heater 6 using heat-resistant metal such as titanium, molybdenum or the like to a prescribed temperature.

Furthermore, the bonding heater 92 is required to shorten time required for cooling to shorten the work tact. For example, time for a use temperature fall from 400° C. to 100° C. needs to be 10 seconds or less. However, in the bonding heater 92 using heat-resistant metal such as titanium, molybdenum or the like, time required to cooling, for example, from 400° C. to 100° C. is 20 seconds or longer even if a water cooling jacket 96 is used as shown in FIG. 6.

SUMMARY OF THE INVENTION

Accordingly, an object of the present invention is to provide a contact heating device which can be assembled so that each element can be individually replaced if either a ceramic heater or tool is damaged.

Another object of the present invention is to provide a contact heating device capable of making a temperature of a tool contact surface uniform.

Another object of the present invention is to provide a contact heating device which does not vibrate so that a semiconductor chip is not displaced and precisely positioned during soldering operation.

Another object of the present invention is to provide a contact heating device capable of being rapidly heated to a prescribed temperature to shorten heating time.

Another object of the present invention is to provide a contact heating device further capable of being rapidly cooled after heated to shorten cooling time.

A contact heating device of the present invention is constituted by a ceramic tool for pressing an object to be heated, a ceramic heater for heating the tool, a heat insulating member for transferring heat generated by the ceramic heater mainly to the tool side and a holder for integrating these members and connecting these members to another member and is characterized in that the tool, ceramic heater, heat insulating member and holder are detachably bonded.

The present invention can provide a contact heating device which can bond semiconductor chips in various sizes by detachably bonding the tool, ceramic heater, heat insulating member and holder and can be easily maintained even if a ceramic heater or tool portion in use is damaged.

In the present invention, the tool is preferably fixed by vacuum suction by the ceramic heater to make each element detachable. On the other hand, the ceramic heater can be threadedly fixed to the heat insulating member and the heat insulating member is threadedly fixed to the holder.

As such vacuum suction means, a ring groove is formed in the ceramic heater surface and communicated to first suction through holes which are disposed penetratingly through the heat insulating member. A second suction through hole can also be disposed which opens in the tool surface and penetrates through the tool, ceramic heater, heat insulating member and holder.

In the contact heating device of the present invention, a heat insulating member and/or holder is provided with a coolant path. so that a coolant is allowed to flow at the time of cooling the ceramic heater in order to directly cool the heater quickly, thereby achieving a rapid temperature fall. Furthermore, since a temperature rise is suppressed by cooling the heat insulating member and holder, thermal deformation of the heat insulating member and holder is made extremely small to decrease packaging accuracy of the chip on the substrate.

As such cooling means, a cooling path allowing a coolant to flow in the heat insulating member and/or holder can be provided. A groove in which the coolant is allowed to flow may be formed in the bonding surface of the ceramic heater and heat insulating member, and at least one cooling hole communicated with the groove can also be penetratingly formed through the heat insulating member to accelerate cooling of the ceramic heater. A groove may also be formed in the bonding surface of the holder so that the grooves is communicated with a cooling hole which is penetratingly formed in the holder to cool the holder.

It is preferable that a thermal conductivity of the tool is 100 W/m·K or higher and that the thermal conductivity of the ceramic heater is 10 W/m·K or higher. On the other hand, a thermal conductivity of the heat insulating member is preferably made 5 W/m·K or lower to achieve a uniform temperature of the tool surface and rapid heating.

The tool, ceramic heater, heat insulating member and holder preferably have a thermal expansion coefficient of $6\times10^{-6}$/K or lower in order to prevent thermal deformation.

BRIEF DESCRIPTION OF THE DRAWINGS

Preferred embodiments of the present invention will be described below in detail with reference to the drawings, in which:

FIG. 6 shows a conventional contact heating device provided with a water-cooling jacket.

DETAILED DESCRIPTION OF THE PREFERRED EMBODIMENTS

Figure 1:
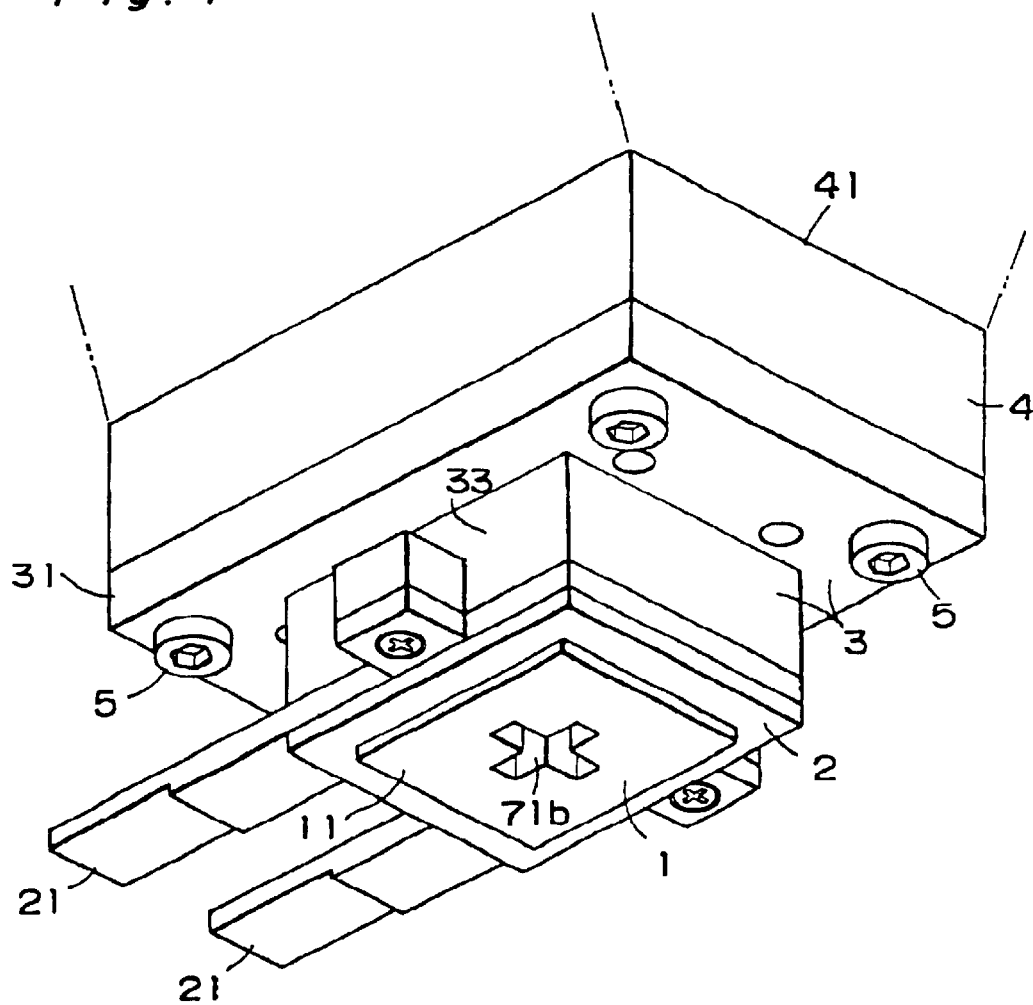
FIG. 1 is a perspective view showing a contact heating device according to an embodiment of the invention viewed from below.
Figure 2:
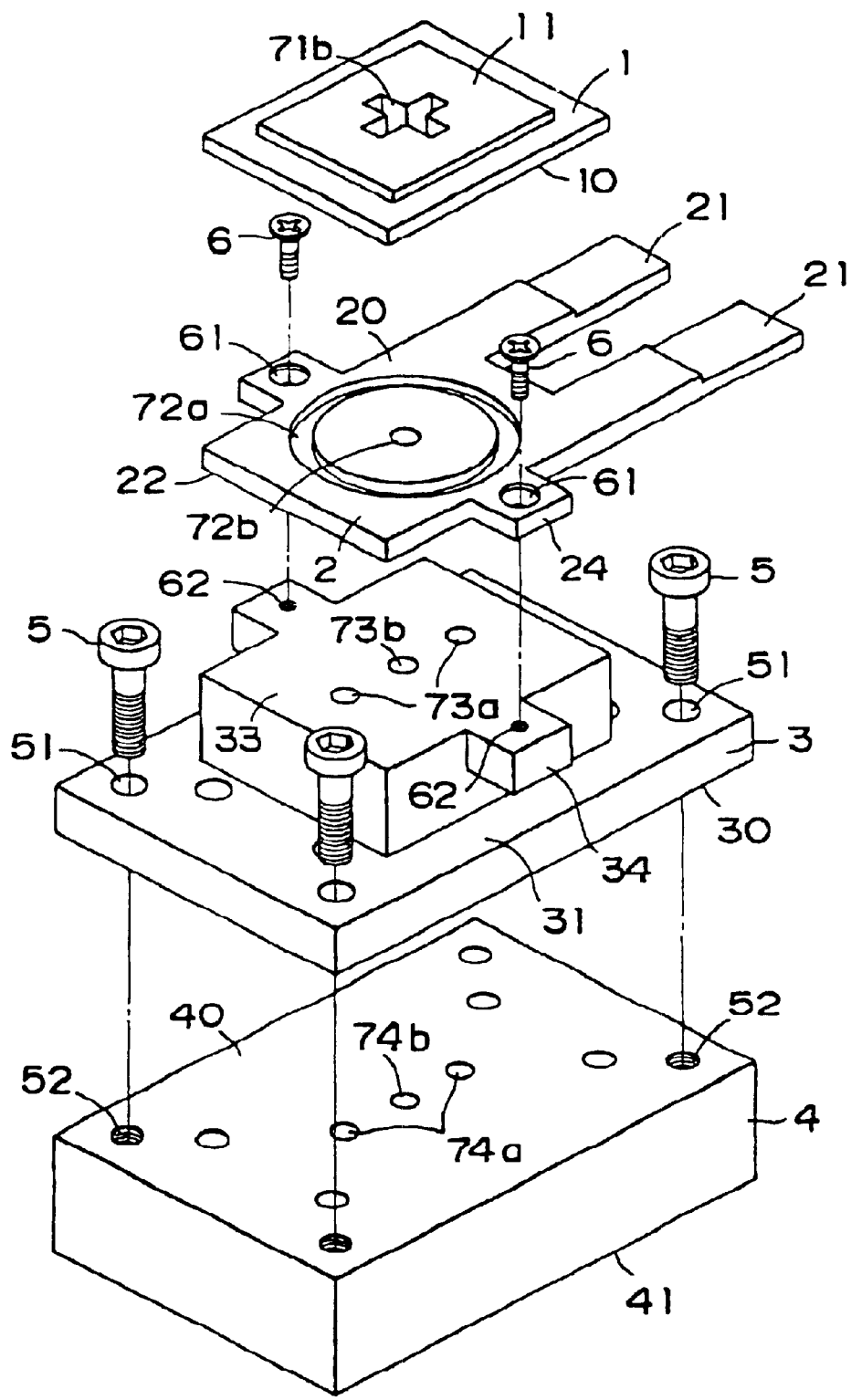
FIG. 2 is an exploded view showing the contact heating device according to the embodiment of the invention shown in FIG. 1.

As shown in FIGS. 1 and 2, a contact heating device of the present invention is provided with a ceramic tool 1 for pressing an object to be heated in contact therewith, a ceramic heater 2 for heating the tool 1, a heat insulating member 3 and a holder 4 for integrating these components and connecting these components to a supporting member of a bonding device. These elements are detachably bonded to the holder.

The heat insulating member 3 is provided between the ceramic heater 2 and holder 4 and transfers heat generated by the ceramic heater 2 mainly to the tool 1 side in order to reduce thermal conduction to the holder 4. The heat insulating member 3 is detachably fixed on a surface of the holder 4 in a mechanical manner. The ceramic heater 2 is detachably fastened to the heat insulating member 3. Consequently, the ceramic heater 2, heat insulating member 3 and holder 4 are integrated so as to be individually replaceable.

In this embodiment, the tool 1 is vacuum-adsorbed to the ceramic heater 2 as described later. The tool 1 heats a semiconductor chip by transferring heat to the semiconductor chip in contact therewith. The tool 1 fixedly vacuum-adsorbs the semiconductor chip as described later.

As a mechanically bonding method, the exploded view of FIG. 2 shows an example of a contact heating device in which the ceramic heater 2 is threadedly fixed to the heat insulating member 3 with bolts 6 and the heat insulating member is threadedly fixed to the holder with bolts 5.

The holder 4 is a rectangular solid base block provided with flat outer surfaces and the heat insulating member 3 is fixed on one surface 40 thereof. The heat insulating member 3 includes a flange 31 of which one surface 30 is placed on the surface 40 of the holder 4 and a stage 32 on which the ceramic heater 2 is fixedly placed thereon. In this example, bolt through holes 51 penetrate through the flange 31 at four corners while bolting holes 52 are threaded and opened at sites corresponding thereto on the upper surface of the holder 4. The heat insulating member 3 is placed on the upper surface of the holder 4 and fixed by screwing bolts 5 into the bolting holes 52 through the bolt through holes 51.

The heat insulating member 3 is provided with a ceramic heater 2 placing surface on the front surface 33 thereof and the ceramic heater 2 is fixed by bolts 6.

The ceramic heater 2 has a shape of a plate in which a heating element is embedded therein and has a pair of leads 21 electrically connected to the heating element in a plate surface direction. Projected portions 24 are provided on both sides in the horizontal direction and bolt through holes 61 are opened. Bolting holes 62 corresponding to the bolt through holes 61 are threaded into projected portions 34 provided in the horizontal direction of the stage 32 of the insulating member 3. The ceramic heater 2 is placed on the stage 32 of the insulating member 3 and fixed by inserting a pair of bolts 6, 6 into the bolt through holes 61 of the ceramic heater 2 and screwing into the bolting holes 62 in the stage of the insulating member 3.

In this example, while the tool 1 is attracted and fixed to the ceramic heater 2 by vacuum suction, the tool 1 can hold and move a semiconductor chip by vacuum suction and press the chip while heating. In this example, the tool 1 has a thin plate shape and a cruciform through hole 71b is formed at a central position. A few kinds of outer shapes and surfaces of the tool 1 are prepared to match shapes of semiconductor chips to be adsorbed.

In a contact heating device shown in FIG. 2, a ring groove 72a is formed in the front surface 20 of the ceramic heater 2 and first suction through holes 73a, 74a penetrating through the heat insulating member 3 and holder 4 so as to be communicated with this ring groove 72a so that the ceramic heater 2 fixes the tool 1 by vacuum suction.

Specifically, to adsorb the tool 1, a ring groove 72a is carved in the tool 1 surface and portions of the ring groove 72a penetrates through to the rear. A pair of through holes 73a, 73a for vacuum suction are provided in the insulating member 3 so as to be communicated with these penetrated portions. Similarly, through holes 74a, 74a communicated with these through holes 73a, 73a are provided in the holder 4. In the holder 4, the through holes 74a, 74a are connected to an external suction device (not shown) and the rear surface 10 of the tool 1 is fixedly adsorbed to the front surface 20 of the ceramic heater 2 by vacuum suction by the ring groove 72a.

Furthermore, in this contact heating device, a second suction through hole opens in the front surface 11 of the tool 1 and is penetratingly communicated with the tool 1, ceramic heater 2, heat insulating member 3 and holder 4, so that the tool can in turn attract and lift semiconductor chips. In this example, the second through holes 71b, 72b, 73b, 74b are penetratingly formed so that the tool 1, ceramic heater 2, insulating member 3 and holder 4 are communicated with each other. After assembly, the holder 4 is sucked by another external suction device (not shown) by the through hole so that the semiconductor chip can be fixedly adsorbed on the end surface of the tool 1. The aperture in the front surface 11 of the tool is formed in a cruciform shape for convenient suction.

In addition to the above method utilizing bolting and vacuum suction, bonding means using a detachable adhesive can be utilized in the contact heating device. A method of fixing by sandwiching the above members by metallic or ceramic plates from sides can also be employed.

Figure 3:
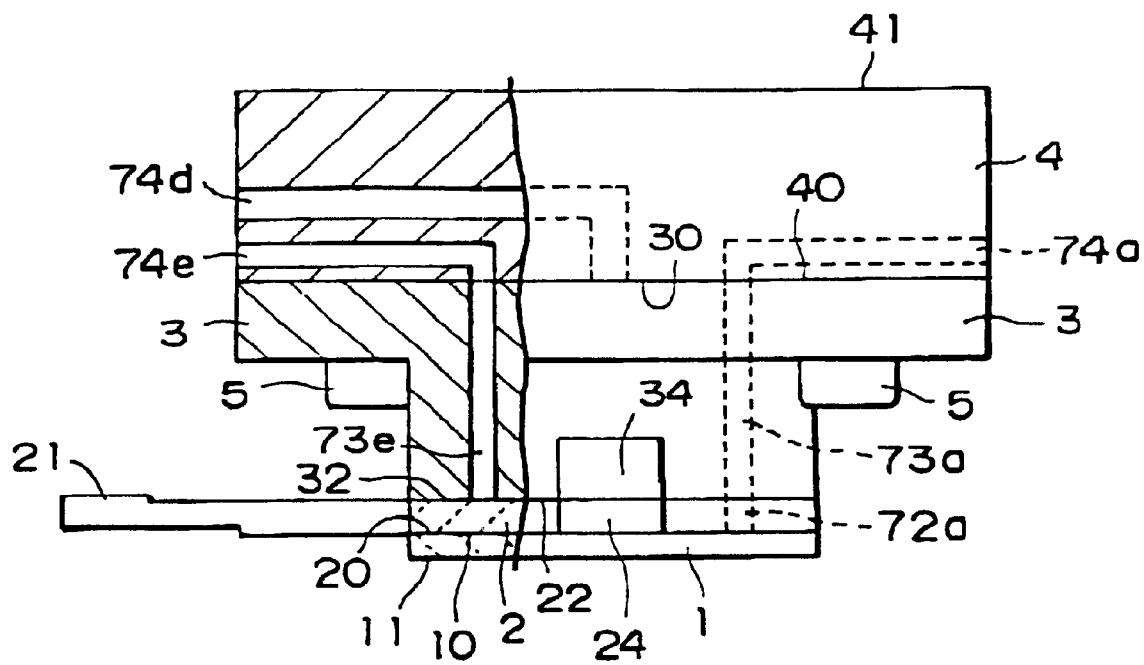
FIG. 3 is a side view showing a contact heating device according to another embodiment of the invention.

FIG. 3 shows a contact heating device in which the aforementioned members are fixed only by vacuum suction. This device has a structure obtained by stacking a tool 1, ceramic heater 2, heat insulating member 3 and holder 4. First suction through holes 72a, 73a, 74a for adsorbing the tool 1 (head) are disposed in the ceramic heater 2, heat insulating member 3 and holder 4, respectively, so as to be communicated with each other.

The embodiment in FIG. 3 shows that a third suction through hole 74d for adsorbing the heat insulating member 3 penetrates through and that the aperture thereof is opposed to the bottom surface 30 (rear surface) of the heat insulating member 3. In this figure, fourth suction through holes 73e, 74e for adsorbing the ceramic heater 2 are further formed penetratingly through the heat insulating member 3 and holder 4, respectively. These elements 1, 2, 3, 4 are vacuum-adsorbed by these suction through-holes and integrally held.

Thus, since the respective elements 1, 2, 3, 4 are only mechanically connected and can be separated, the device can be applied to various semiconductor chip sizes of different dimensions only by replacing the tool 1 and ceramic heater 2. Furthermore, if any one of the elements is damaged, only the damaged member needs to be replaced.

Another embodiment of the present invention relates to a contact heating device provided with cooling means. In this embodiment, the cooling means includes means for accelerating cooling of the ceramic heater at the time of a temperature fall, thereby increasing a temperature fall speed. Furthermore, the cooling means includes means for preventing a temperature rise of the holder to prevent. deformation thereof.

Figure 4:
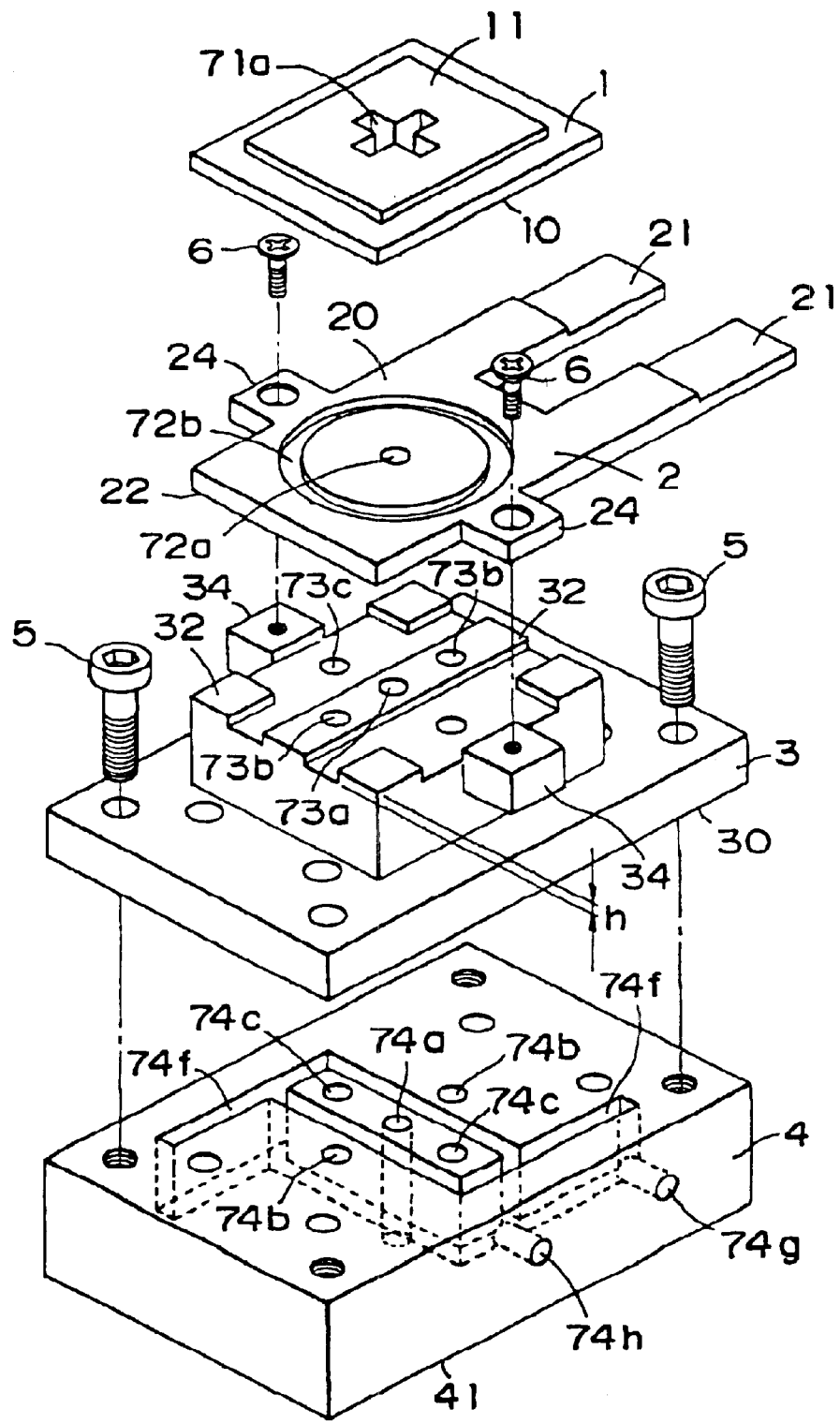
FIG. 4 is a side view showing a contact heating device according to another embodiment of the invention in which a cooling medium path is disposed in the holder.

As cooling means for increasing a temperature fall speed according to the present invention, as shown in FIG. 4, a pair of shallow grooves are formed with a clearance therebetween in the heat insulating member 3 surface. When the ceramic heater 2 is bonded, a pair of gaps 73d, 73d are provided between the heat insulating member 3 and ceramic heater 2. Cooling hole 73c penetrating through the heat insulating member 3 open to those gaps 73d, 73d and these cooling holes 73c are communicated with cooling holes 74c penetrating through the holder 4. The spaces 3d and cooling holes 73c, 74c constitute a coolant path. At the time of cooling after heating the heater, a gas as a coolant is allowed to flow through the cooling holes 74c, 73c through the gaps 73d to directly and forcibly cool the ceramic heater 2. Consequently, the ceramic heater 2 can be cooled in a shorter time than by a conventional indirect cooling method.

It is preferable that two or more of the cooling holes 73c, 74c having a diameter of 1–5 mm are provided. The height h of the gap 73d is preferably 0.5–2 mm. The spaces are open to the side surfaces and a gas as the coolant is evenly diffused to the outer surroundings. It is not preferable that the space has a height h of less than 0.5 mm since a pressure loss is increased due to the gas flow, thereby requiring pre-load of the gas. It is not preferable either that the height is 2 mm or more since the volume of the gap 73d is increased and the gas is replaced slowly, thereby making cooling slow.

Furthermore, since the gaps 73d are formed between the ceramic heater 2 and heat insulating member 3, the contact area between the ceramic heater 2 and heat insulating member 3 is reduced 20% or more. Thus, heat transfer to the heat insulating member 3 side is reduced, thereby increasing a temperature rise speed of this ceramic heater 2.

Cooling means for preventing thermal deformation of the holder 4 to improve mounting accuracy will be described below. To prevent thermal deformation of the contact heating device, it is effective to minimize heating of the holder 4 composed of metallic material. Therefore, shallow grooves 74f, which are coolant paths, are provided in a contact surface 40 of the holder 4 brought into contact with the heat insulating member 3 and a mounting surface 41 of the holder 4 to be mounted to a device. A gas as a cooling medium is supplied from a gas supply hole 74g. The heat insulating member 3 and holder 4 are cooled by allowing the gas in the grooves 74f, 74f formed in the upper and lower surfaces thereof. Air flowing in the grooves 74f is gradually diffused from a bonding surface of the holder 4 and heat insulating member 3 or a bonding surface of the holder 4 and a supporting member of a bonding device.

Consequently, even when the ceramic heater 2 is used as a constant heater, which is continuously used at a high temperature of about 500° C., both the heat insulating member 3 and holder 4 can be maintained at a low temperature of about 50° C., thereby preventing thermal deformation. This groove 74f for cooling has similar effects when formed not in the both surfaces of the heat insulating member 3 and holder 4, but inside thereof.

As a coolant gas, gases such as air, nitrogen gas, carbonic acid gas and the like can be used. Carbonic acid gas is an excellent coolant due to its large heat capacity. When an open system is employed for exhaustion, air is preferably used as a coolant from the viewpoint of safety. A flow rate of the gas is preferably about 300–50000 normal cm$^3$/min per path.

Figure 5A:
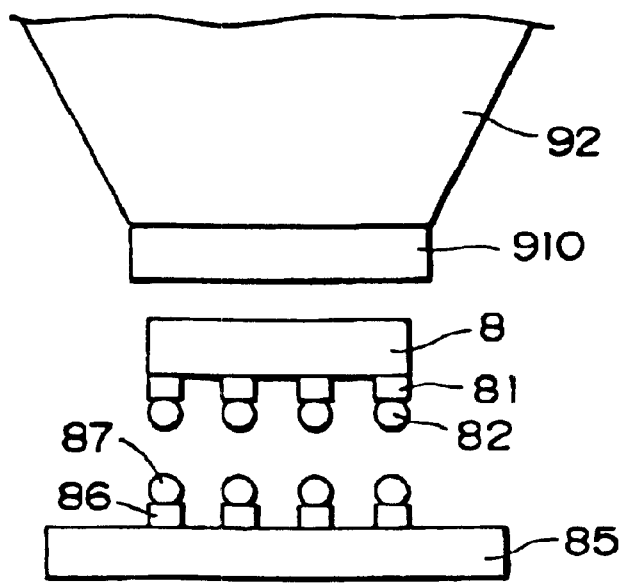
FIG. 5A shows a conventional contact heating device being used at the time of bonding.

In the contact heating device of the present invention, it is preferable that a thermal conductivity of the tool 1 is 100 W/m·K or higher and that a thermal conductivity of the ceramic heater 2 is 10 W/m·K or higher. Such a thermal conductivity is determined because the problem can be solved that the temperature of a peripheral portion of the tool 910 is low due to heat dissipation into air in the conventional bonding heater 92 shown in FIG. 5A. In FIG. 1 of the present invention, a temperature fall of the peripheral portion of the tool 1 due to heat dissipation into air can be prevented by increasing a thermal conductivity of the tool 1 and ceramic heater 2 to the aforementioned range. At the same time, heat generated by the ceramic heater 2 can be efficiently supplied to the tool 1 side and the temperature fall of the peripheral portion of the tool 1 can be prevented by employing the heat insulating member 3 having a lower thermal conductivity than that of the ceramic heater.

Since a tool 1 having a thermal conductivity lower than 100 W/m·K has a large temperature distribution therein, a temperature distribution on a semiconductor chip becomes large and thereby variations of solder chip bonding can occur. In addition, a ceramic heater 2 having a thermal conductivity lower than 10 W/m·K is not preferable since the temperature distribution on the surface thereof becomes large and variations in the temperature distribution on the semiconductor chip occur.

Furthermore, the thermal expansion coefficient of the tool 1, ceramic heater 2, heat insulating member 3 and holder 4 is preferably $6 \times 10^{-6}$/K or lower. By setting such a low thermal expansion coefficient, displacement due to expansion or contraction at the time of heating or cooling of each element can be reduced and displacement at the time of semiconductor chip mounting, which is a problem in the conventional pulse heater method, can be reduced.

Furthermore, the thermal conductivity of the heat insulating member 3 is preferably 5 W/m·K or lower. Since such a heat insulating member 3 restricts heat transfer to the holder side and thereby heat is transferred to the ceramic tool 1 side, performance of heating the tool 1 can be improved and time to soften and melt a bond material solder alloy or conductive adhesive for bonding a semiconductor chip and circuit substrate can be shortened.

Materials meeting thermal-requirements of the above elements of the contact heating device of the present invention are described below. As the tool 1 for pressing an object to be heated, a sintered body containing aluminum nitride, silicon carbide or the like as a main ingredient is used. These aluminum nitride sintered body and silicon carbide sintered body can have a thermal conductivity of 100 W/m·K or higher and a thermal expansion coefficient $6 \times 10^{-6}$/K or lower.

The aluminum nitride sintered body can contain $Al_2O_3$, $Y_2O_3$, $Yb_2O_3$ or the like as a sintering additive. To manufacture the tool 1 from aluminum nitride ceramic, an aluminum nitride powder and a desired sintering additive powder such as $Al_2O_3$, $Y_2O_3$, $Yb_2O_3$ or the like are adjusted to prepare a desired composition and mixed with the balls of alumina or silicon nitride in a ball mill, vibrating mill or the like to increase mixing efficiency with a non-aqueous solvent such as methanol, IPA or the like. The obtained aluminum nitride slurry is passed through a sieve of about 200 meshes, dried by a explosion-proof drier at about 120° C. for about 24 hours and then passed through a sieve of about 40 meshes. The obtained aluminum nitride is granulated by mixing a desired organic binder and employing a method of spray drying, dry-type or wet-type granulating. The granulated substances are formed into a molded body by a press or CIP molding process, and then the organic binder is removed at about 500–700° C. The obtained molded body is sintered in the presence of nitrogen at about 1800–2000° C. In another method, the granulated substances may be directly sintered by hot pressing in which molding and sintering are performed at the same time in a carbon die.

To obtain a tool from a silicon carbide sintered body, 0.2–4.0 weight % of boron carbide or, as required, 0.5–5 weight % of rare-earth element oxide is added to silicon carbide and sintered in vacuum at 1900–2100° C.

It is preferable to use a ceramic heater 2 having a heating resistor buried in a ceramic containing silicon nitride, silicon carbide, alumina, aluminium nitride or the like as a main ingredient. For example, silicon carbide is used to obtain a sintered body by containing B, C or the like as a sintering additive. When silicon nitride is used, a sintered body containing $Y_2O_3$, $Al_2O_3$, $Yb_2O_3$ or the like as a sintering additive is used. When silicon carbide or silicon nitride is used, a ceramic heater 2 having a thermal conductivity of 10 W/m·K or higher and a thermal expansion coefficient of $6 \times 10^{-6}$/K or lower can be obtained.

To manufacture a ceramic heater 2, the above sintering additive is blended to the silicon nitride powder or silicon carbide powder to prepare a desired composition and mixed with $Al_2O_3$ media with a non-aqueous solvent such as methanol, IPA or the like by a ball mill, vibrating mill or the like. The obtained slurry is dried by a drier at about 120° C. and then passed through a sieve of about 40 meshes.

A desired organic binder is mixed with the mixture powder obtained here by a method such as a spray drying method or the like and a desired shape is obtained by press or CIP molding. The molded body is debinded at about 500–700° C. and sintered at about 1800–2000° C. in the presence of nitrogen to obtain a plate of silicon nitride or silicon carbide. The silicon nitride or silicon carbide plate may be sintered by hot pressing in which molding and sintering are directly performed at the same time in a carbon die.

The silicon nitride or silicon carbide plate so obtained is utilized as a ceramic heater as described below. When silicon carbide is used in a ceramic heater 2, the silicon carbide be used as a heating element by passing current through the silicon carbide itself due to its characteristics as semiconductor.

On the other hand, when silicon nitride is utilized in a ceramic heater 2, a heating element is formed due to its insulating characteristic. A conductive ceramic or metallic resistance heating element such as W/Mo, WC or the like is printed on the of surface of or inside silicon nitride and then the heating element is printed on the silicon nitride later or at the same time as sintering of the silicon nitride in a reducing atmosphere or the like to integrate these. The metal lead wire is brazed to the heating element composed of conductive ceramic or metal by using braze material such as AgCu, Ag, Cu or the like and this brazed metal lead wire is energized.

For example, in a ceramic heater 2 containing silicon nitride as a main ingredient, a silicon nitride powder, rare-earth element oxide such as $Y_2O_3$, $Yb_2O_3$ or the like and desired sintering additive powder such as $Al_2O_3$, $SiO_2$ or the like are adjusted to prepare a desired composition. Then, a heating resistor pattern containing high melting point metal such as W, Mo or the like or carbide thereof as a main ingredient and lead electrodes are printed on the molded body molded under a pressure of 1 ton/cm$^2$. Then, onto the molded body is stacked and boded another molded body which is subjected to hot press at 1650–1750° C. or fired at 1700–1850° C. in a nitrogen atmosphere of 10 atmosphere or more to obtain a sintered body. The main surfaces of the combined bodies are ground with precise dimensions and the lead electrode portion is separately ground to expose the lead electrode. Electrode metal fittings are connected by braze material to obtain a ceramic heater 2.

To manufacture a ceramic heater 2 containing alumina as a main ingredient, an alumina powder and material to which an appropriate amount of $SiO_2$, MgO and CaO as a sintering additive are added are mixed. A heating resistor containing one or more kinds from W, Mo and Re as a main ingredient and electrode lead portion are printed on a surface of an tape cast alumina tape to form an electrode pad on the rear surface of the electrode lead portion. Then, a through hole is formed and brought into conduction by filling an paste having the same material therein as that of the electrode lead portion. After another aluminum nitride tape is stacked and bonded on the heating resistor, a sintered body is obtained by firing in a reducing atmosphere at 1500–1600° C. After the electrode pad is plated with nickel, electrode metal fittings are connected by brazing to obtain a ceramic heater 2.

To manufacture a ceramic heater containing aluminium nitride as a main ingredient, an appropriate amount of rare-earth element oxide such as $Y_2O_3$, $Yb_2O_3$ or the like and alkaline-earth oxide such as CaO, MgO or the like as sintering additives are mixed with an aluminium nitride powder. A heating resistor containing one or more kinds from W, Mo, Re and carbide thereof or nitride thereof as a main ingredient and an electrode lead portion are printed on a surface of a tape cast aluminium nitride tape to form an electrode pad on the rear surface of the electrode lead portion. Then, a through hole is formed and brought into conduction by filling an paste having the same material therein as that of the electrode lead portion. After another alumina tape is stacked and bonded on the heating resistor, a sintered body is obtained by sintering in a vacuum or nitrogen atmosphere at 1700–1950° C. After the electrode pad is subjected to Ni plating, electrode metal fittings are connected by brazing to obtain a ceramic heater 2.

AuCu, AuNi or AgCu braze material can be used as braze material used for brazing the ceramic heater 2.

Mullite ceramic or mullite-cordierite ceramic having porosity of about 5–30% can be used as the heat insulating member 3. When the heat insulating member 3 having this porosity is sintered while dispersing resin beads in the generated body, a sintered body satisfying strength and heat insulation at the same time can be obtained. If simply only a porous sintered body needs to be obtained, a porous heat insulating member can be obtained by sintering at a temperature lower than a sintering temperature or sintering by using material having a large grain size.

Thus, a heat insulating member 3 having a thermal conductivity of 5 W/m·K or lower and a thermal expansion coefficient of $6\times10^{-6}$/K or lower can be obtained.

As a holder for integrating the component members except for the ceramic tool 1 and connecting these members to another member, for example, invar alloy having a thermal expansion coefficient of $6\times10^{-6}$/K or lower by adjusting the amount of added Ni can be used.

EXAMPLE 1

Here, the adaptability and maintenance characteristics to different semiconductor chip sizes were compared between the contact heating device of the present invention and a conventional contact heating device.

The ceramic heater of the present invention was manufactured as described below according to the structure shown in the embodiment of the present invention as shown in FIGS. 1 and 2.

A tool 1 having a rectangular external shape of 24×24 mm and a thickness of 2 mm was obtained by mixing an aluminium nitride powder containing $Yb_2O_3$ as a sintering additive with a binder and pressing in a die, sintering in a nitrogen atmosphere at 1900° C. and machining by surface grinding. A cruciform through hole 71 was penetratingly formed at the central portion of the tool 1.

To obtain a ceramic heater, a silicon nitride or aluminium nitride powder containing $Yb_2O_3$ as a sintering additive was mixed with a binder and subjected to press molding to obtain square molded bodies of 50 mm. A tungsten carbide WC paste was printed on one molded body as a heating element and another molded body was combined to obtain an aggregate by placing the WC paste between these two molded bodies.

The aggregate was hot pressed at 1700–1800° C. to obtain sintered bodies of, respectively, silicon nitride and aluminum nitride, incorporated with a WC heating element. These were processed by using a surface grinder or ultrasonic machine to obtain a heater having an external shape of 24×24 mm and a thickness of 3 mm and bolt through holes 61 penetrated on both sides. Then, pad electrodes 21, a second through hole 72b and a ring groove 72a for vacuum suction were formed to obtain a ceramic heater 2.

A heat insulating member 3 was formed by processing porous mullite material by using a surface grinder or ultrasonic machine so that the dimensions thereof matched those of the ceramic heater 2. Bolt through holes 51 and bolting holes 62 for fastening the heater were punched and first and second through holes 73a, 73b for vacuum suction were further punched at prescribed positions. The thermal conductivity of the heat insulating member 3 was changed by adjusting the porosity.

A holder 4 was prepared by processing FeNi alloy (invar alloy) containing much Ni by a surface grinder or ultrasonic machine so that the dimensions thereof matched those of the heat insulating member 3. Bolting holes 52 were threaded at corners by machining and first and second through holes 74a, 74b for vacuum suction were formed at the central portion.

The thermal expansion coefficient of the holder 4 was changed by changing the Ni content in the alloy.

Figure 5B:
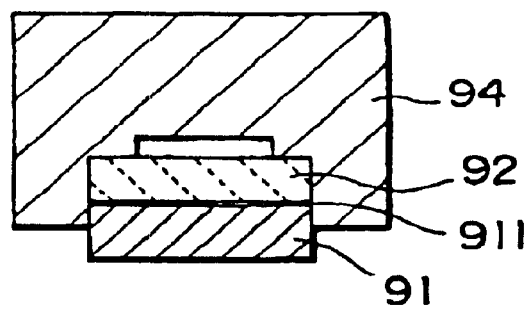
FIG. 5B is a cross section of the conventional contact heating device.

The conventional contact heating device was obtained by bonding a ceramic heater 92 and head 16 with bond material 911 as shown in FIG. 5B and fixing this to the holder 94.

Table 1 shows comparison of adaptability and maintenance characteristics to various semiconductor chip sizes between these sample.

TABLE 1

|  | Adaptability to semiconductor chips | Maintenance |
| --- | --- | --- |
| Pulse heater | Adaptable to specific chip size only | Heater and tool replaced simultaneously |
| Embodiment | Adaptable to various chip sizes | Heater and tool can be separately replaced. |

In the contact heating device of the present invention shown in FIGS. 1 and 2, a ceramic tool 1 for pressing an object to be heated and a ceramic heater 2 for heating the tool 1 are provided separatably and a heat insulating member 3 for transferring heat to the ceramic tool 1 side and holder 4 are mechanically fastened by bolts 5. Therefore, the tool can respond to various semiconductor chip sizes. In maintenance as well, the tool and ceramic heater can be separately replaced. Thus, the separatable contact heating device of the present invention solves the problem that the conventional fixed type contact heating device cannot respond to various semiconductor chip sizes and that if any of the tool and ceramic heater is damaged, both of them need to be replaced.

EXAMPLE 2

In this example, the relationship of a thermal conductivity of the ceramic heater 2 and tool 1 to a temperature distribution on a semiconductor chip 8 heated by a contact heating device using the same was investigated.

The thermal conductivity of the tool 1 was adjusted by adjusting the contents of $Yb_2O_3$ and aluminium nitride. The thermal expansion coefficient of the ceramic heater 2 was changed by selecting silicon nitride or aluminium nitride to be used as a ceramic heater 2. The thermal conductivity thereof was changed by changing the composition of silicon nitride or aluminium nitride and $Yb_2O_3$.

In this example, the thermal conductivity of the ceramic tool 1 was set to be 100 W/m·K or higher and that of the ceramic heater 2 was set to be 10 W/m·K or higher. In this example, the temperature of a peripheral portion of the tool 1 fell and heat generated by the ceramic heater 2 could be supplied at the same time due to heat dissipation into air by increasing the thermal conductivity of the tool 1 and ceramic heater 2. The temperature distribution on the semiconductor chip was measured by a thermoviewer while changing the thermal conductivity of the tool 1 and ceramic heater 2 and prevention of a temperature fall in the peripheral portion of the tool 1 was compared.

The results are shown in Table 2.

TABLE 2

| | Heat conductivity W/m.K | | Temperature distribution ΔT |
| --- | --- | --- | --- |
| Sample | Heater | Tool | (° C.) |
| Sample 1 | 9 | 90 | 9 |
| Sample 2 | 20 | 110 | 4 |
| Sample 3 | 9 | 110 | 7 |
| Sample 4 | 20 | 90 | 8 |
| Comparative | — | — | 30 |

This example shows that temperature differences between the highest temperature point and lowest point were all 10° C. or less on the semiconductor chip. In particular, the temperature difference was made 5° C. or less by setting the thermal conductivity of the ceramic tool 1 to be 100 W/m·K or higher and that of the ceramic heater 2 to be 10 W/m·K or higher.

On the other hand, the temperature difference between the highest temperature point and lowest point on the semiconductor chip was as large as 30° C. in the conventional pulse heater, in which the temperature was rapidly increased by passing large current through titanium or molybdenum.

EXAMPLE 3

In this example, the thermal expansion coefficients of all the ceramic tool 1, ceramic heater 2, heat insulating member 3 and holder 4 were set to be as low as $6 \times 10^{-6}$/K or lower. By reducing change in dimensions of each component member in the heating and cooling processes, displacement of a semiconductor chip with respect to the substrate upon mounting a semiconductor chip was compared with that in the case of employing a conventional pulse heater method. The displacement of the chip was measured by using a laser interferometer.

The results are shown in Table 3.

TABLE 3

| | Thermal expansion coefficient ($\times 10^{-6}$/K) | | | | |
| --- | --- | --- | --- | --- | --- |
| | Tool | Heater | insulating material | Holder | Displacement ($\mu$m) |
| Sample 1 | 4.5 | 3.2 | 3.2 | 5.0 | 9 |
| Sample 2 | 4.5 | 4.4 | 3.2 | 5.0 | 10 |
| Sample 3 | 4.5 | 3.2 | 3.2 | 6.5 | 18 |
| Comparative | — | — | — | — | 40 |

In this example, displacement of the semiconductor chip was 20 micron or less in all cases. In particular, displacement could be made 10 $\mu$m or less by setting the thermal expansion coefficients of all the ceramic tool 1, ceramic heater 2, heat insulating member 3 and holder 4 to be as low as $6 \times 10^{-6}$/K or lower. This is great improvement as compared with the conventional pulse heater, in which the displacement was 40 micron.

EXAMPLE 4

In this example, a temperature rise time from heat generation by the ceramic heater to 25–350° C. was evaluated in relation to a thermal conductivity of the heat insulating member 3. The thermal conductivities of samples were changed to 1, 2, 4 and 6 W/m·K by adjusting porosity of the heat insulating member 3 and the heat insulating member was manufactured as described in Example 1. A pulse heater was used for comparison.

The results are shown in Table 4.

TABLE 4

|  | Heat conductivity (W/m.K) of insulating material | Temp. rise rate (s) |
| --- | --- | --- |
| Sample 1 | 6 | 1.9 |
| Sample 2 | 4 | 1.4 |
| Sample 3 | 2 | 1.1 |
| Sample 4 | 1 | 1.0 |
| Comparative | — | 3.2 |

In the conventional pulse heater, the temperature rise time until the adhesive was softened was 3.2 seconds. On the other hand, in the samples of the Example in which the thermal conductivities of the heat insulating member 3 were set to be within a range of 1–6 W/m·K, the temperature rise time was 2 seconds or shorter. It was found that the temperature rise time could be made 1.5 seconds or shorter by setting 5 W/m·K or lower.

EXAMPLE 5

Here, the cooling speed was compared between the contact heating device of the present invention and conventional contact heating device. The contact heating device using the ceramic heater of the present invention shown in FIGS. 1 and 4 and the conventional bonding heater shown in FIG. 5B were prepared.

An aluminum nitride powder containing $Yb_2O_3$ as a sintering additive was mixed with a binder, subjected to press molding in a die, wintered in a nitrogen atmosphere at 1900° C. and machined by a surface grinder to obtain a rectangular tool 1 having an area of 24×24 mm and a thickness of 2 mm.

A silicon nitride powder or aluminium nitride powder containing $Yb_2O_3$ as a sintering additive is mixed with a binder and then subjected to press molding to obtain a 50-mm square molded bodies of silicon nitride or aluminium nitride. Then, a WC paste is printed as a heating resistor and hot pressing is performed at 1700–1800° C. while sandwiching the WC paste with another 50-mm square molded body of silicon nitride or aluminium nitride to obtain a sintered body incorporating WC as a heating resistor. The heat generation unit was made 24×24 in shape and 3 mm in thickness by using a surface grinder or ultrasonic machine and bolting holes were formed on both sides. Further, legs for an electrode lead portion, vacuum suction holes and vacuum suction groove were formed to obtain a ceramic heater 2.

The heat insulating member 3 was manufactured by processing porous mullite material by a surface grinder or ultrasonic machine so that the dimensions thereof matched those of the heater 2. The thermal conductivity of the heat insulating member 3 was changed by adjusting porosity.

A holder 4 was formed by processing Fe—Ni Invar alloy by using a surface grinder or ultrasonic machine so that the dimensions thereof matched those of the heat insulating member 3. The thermal expansion coefficient of the holder 4 was changed by changing the Ni content in the alloy.

The contact heating device of the present invention was manufactured by mechanically fastening a ceramic tool 1 for pressing an object to be heated, a ceramic heater 2 containing ceramic as a main ingredient for heating the tool, a heat insulating member 3 for transferring heat generated by the ceramic heater 2 mainly to the ceramic tool side and a holder 4 for integrating the respective component members and connecting these members to another member by using bolts 5 or the like.

As shown in FIG. 4, two gaps 73*d* having a height h of 0.5 mm were provided between the heat insulating member 3 and ceramic heater 2 to form a coolant path. Air was allowed to flow through this path as a coolant in order to directly and forcibly cool the ceramic heater 2.

As shown in FIG. 6, in the conventional contact heating device, the bonding heater 92 and head 91 were attached to the heater holder 94 and this was fixed to a holder 95 incorporating a water cooling jacket 96 to obtain a contact heating device.

Then, the cooling speed of the ceramic heater 2 was compared between these samples.

The results are shown in Table 5.

TABLE 5

|  | Temperature fall time (s) in temperature range of | |
| --- | --- | --- |
|  | 400° C.–100° C. | 400° C.–200° C. |
| Example | 8.0 | 3.5 |
| Comparative example | 30 | 18 |

As shown in Table 5, cooling times from 400° C. to 100° C. and from 400° C. to 200° C. required by the conventional example were 30 seconds and 18 seconds, respectively. On the other hand, the cooling times required by the Example of the present invention were 8 seconds and 3.8 seconds, respectively. Thus, it was found that the cooling time could be shortened to 10 seconds or less.

EXAMPLE 6

Here, reduction of thermal deformation due to cooling of the heat insulating member 3 and holder 4 was shown. By using aluminium nitride having a thermal expansion coefficient of $4.5 \times 10^{-6}$/K as a ceramic tool 1, silicon nitride having a thermal expansion coefficient of $3.2 \times 10^{-6}$/K and aluminium nitride having a thermal expansion coefficient of $4.5 \times 10^{-6}$/K as a ceramic heater 2, silicon nitride having a thermal expansion coefficient of $3.2 \times 10^{-6}$/K as a heat insulating member 3 and invar alloy having a thermal expansion coefficient of $5.0 \times 10^{-6}$/K as a holder 4, three kinds of contact heating devices were prepared as described in Example 5 as shown in Table 6 and air was allowed to flow at a rate of 2000 Ncm³/min through the cooling holes to cool the heat insulating member 3 and holder 4.

A conventional contact heating device shown in FIG. 6 was used for comparison.

Evaluation was performed by measuring displacement of the semiconductor chip mounted product by using a laser interferometer after subjecting the ceramic heater 2 to 100 cycles of temperature rises and falls between 100° C. and 500° C.

The results are shown in Table 6.

TABLE 6

| | Thermal expansion coefficient (×10⁻⁶/K) | | | |
|---|---|---|---|---|
| | Tool | Heater | insulating material | Holder | Displacement (μm) |
| Sample 1 | 4.5 | 3.2 | 3.2 | 5.0 | 9 |
| Sample 2 | 4.5 | 4.5 | 3.2 | 5.0 | 10 |
| Sample 3 | 4.5 | 3.2 | 3.2 | 5.0 | 18 |
| Comparative example | — | — | — | — | 40 |

As shown in Table 6, in a semiconductor chip mounted product of the comparative example using the conventional contact heating device, displacement of 40 μm occurred as compared with the initial state. On the other hand, the samples 1–3 of the Example of the present invention had displacement of 20 μm or less. It was found that displacement could be reduced by cooling the heat insulating member 3 and holder 4. When the conventional contact heating device was used, the temperature of the holder 4 rose to 130° C. However, it was found that the holder 4 of the samples 1–3 of the Example of the present invention rose to 50–60° C., that is, the temperature rise could be largely restricted.

What is claimed is:

1. A contact heating device comprising: a ceramic tool for pressing an object to be heated; a ceramic heater for heating the tool in contact therewith; a heat insulating member for supporting and thermally shielding the ceramic heater; and a holder for supporting the heat insulating member and holding these element of the contact heating device, wherein the tool, ceramic heater, heat insulating member and holder are detachably bonded.

2. The contact heating device according to claim 1, wherein the tool is fixed by vacuum suction by the ceramic heater.

3. The contact heating device according to claim 2, wherein the ceramic heater is threadedly fixed to the heat insulating member and the heat insulating member threadedly fixed to the holder.

4. The contact heating device according to claim 2, wherein a ring groove is formed in the ceramic heater surface and first suction through holes which penetrate through the heat insulating member and holder so as to be communicated with the ring groove are disposed.

5. The contact heating device according to claim 2, wherein a second suction through hole which opens in the tool surface and is penetratingly communicated with the tool, ceramic heater, heat insulating member and holder is disposed.

6. The contact heating device according to claim 1, wherein a thermal conductivity of the tool is 100 W/m·K or more and a thermal conductivity of the ceramic heater is 10 W/m·K or more.

7. The contact heating device according to claim 6, wherein porosity of the heat insulating member is 30% or less.

8. The contact heating device according to claim 6, wherein a thermal conductivity of the heat insulating member is 5 W/m·K or less.

9. The contact heating device according to claim 1, wherein thermal expansion coefficients of the tool, ceramic heater, heat insulating member and holder are 6×10⁻⁶/K or less.

10. The contact heating device according to claim 1, wherein the heat insulating member and/or holder is provided with a cooling path through which a coolant is allowed to flow therein.

11. The contact heating device according to claim 10, wherein the cooling path comprises: a groove, through which the coolant is allowed to flow, which is formed in the bonding surface of the heat insulating member adjacent to the ceramic heater; and a cooling hole which is communicated with the groove and penetratingly formed through the heat insulating member and holder, to promote cooling of the ceramic heater.

12. The contact heating device according to claim 10, wherein the cooling path comprises: a groove which is formed in the bonding surface of the holder adjacent to the heat insulating; and a cooling hole which is penetratingly formed through the holder and communicated with the groove, to cool the holder.

13. The contact heating device according to claim 10, wherein the coolant is a gas.

* * * * *